United States Patent
Mauder et al.

(10) Patent No.: US 9,875,935 B2
(45) Date of Patent: Jan. 23, 2018

(54) SEMICONDUCTOR DEVICE AND METHOD FOR PRODUCING THE SAME

(71) Applicant: Infineon Technologies Austria AG, Villach (AT)

(72) Inventors: Anton Mauder, Kolbermoor (DE); Ralf Otremba, Kaufbeuren (DE); Hans-Joachim Schulze, Taufkirchen (DE)

(73) Assignee: Infineon Technologies Austria AG, Villach (AT)

( * ) Notice: Subject to any disclaimer, the term of this patent is extended or adjusted under 35 U.S.C. 154(b) by 92 days.

(21) Appl. No.: 13/791,071

(22) Filed: Mar. 8, 2013

(65) Prior Publication Data
US 2014/0252373 A1    Sep. 11, 2014

(51) Int. Cl.
| | | |
|---|---|---|
| H01L 21/30 | (2006.01) | |
| H01L 21/78 | (2006.01) | |
| H01L 21/02 | (2006.01) | |
| H01L 21/324 | (2006.01) | |
| H01L 21/20 | (2006.01) | |
| H01L 29/16 | (2006.01) | |

(52) U.S. Cl.
CPC ........ *H01L 21/78* (2013.01); *H01L 21/02378* (2013.01); *H01L 21/7806* (2013.01); *H01L 21/7813* (2013.01); *H01L 21/2007* (2013.01); *H01L 21/324* (2013.01); *H01L 29/1608* (2013.01)

(58) Field of Classification Search
CPC ............. H01L 21/78; H01L 21/02378; H01L 29/1608; H01L 21/02115; H01L 21/02282; H01L 21/2007; H01L 21/76251; H01L 21/324
USPC .... 438/455, 458, 460; 257/77, E21.211, 140
See application file for complete search history.

(56) References Cited

U.S. PATENT DOCUMENTS

| | | | | |
|---|---|---|---|---|
| 6,180,444 | B1 * | 1/2001 | Gates | H01L 27/0814 257/E21.358 |
| 7,635,635 | B2 * | 12/2009 | Yilmaz | H01L 21/6835 257/E21.088 |
| 7,718,508 | B2 * | 5/2010 | Lee | H01L 21/187 257/302 |
| 8,163,581 | B1 * | 4/2012 | Or-Bach | H01L 31/0725 438/39 |
| 8,916,451 | B2 * | 12/2014 | Bayram et al. | 438/458 |

(Continued)

FOREIGN PATENT DOCUMENTS

| | | |
|---|---|---|
| CN | 1427449 A | 7/2003 |
| CN | 1669122 A | 9/2005 |

(Continued)

*Primary Examiner* — Thinh T Nguyen
(74) *Attorney, Agent, or Firm* — Murphy, Bilak & Homiller, PLLC (57) ABSTRACT

A method for producing a semiconductor device is provided. The method includes providing a semiconductor substrate, providing at least one semiconductor device on the substrate, having a back face opposite the semiconductor substrate and a front face towards the semiconductor substrate, providing a contact layer on the back face of the semiconductor device, bonding the contact layer to an auxiliary carrier, and separating the at least one semiconductor device from the substrate. Further, a semiconductor device produced according to the method and an intermediate product are provided.

23 Claims, 7 Drawing Sheets

(56) References Cited

U.S. PATENT DOCUMENTS

| | | | | |
|---|---|---|---|---|
| 2003/0153163 | A1* | 8/2003 | Letertre | H01L 21/2007 438/458 |
| 2006/0226482 | A1 | 10/2006 | Suvorov et al. | |
| 2007/0238263 | A1* | 10/2007 | Yilmaz | H01L 21/6835 438/455 |
| 2008/0038564 | A1* | 2/2008 | Bruel | C30B 29/06 428/446 |
| 2008/0038902 | A1* | 2/2008 | Lee | H01L 21/187 438/458 |
| 2011/0316120 | A1 | 12/2011 | Rogers et al. | |
| 2012/0083098 | A1 | 4/2012 | Berger et al. | |
| 2012/0211770 | A1* | 8/2012 | Shiomi | H01L 21/0495 257/77 |
| 2012/0234887 | A1* | 9/2012 | Henley | H01L 21/67092 225/1 |
| 2013/0146936 | A1* | 6/2013 | Tsai | H01L 33/38 257/99 |
| 2014/0220764 | A1* | 8/2014 | Bayram | H01L 21/76251 438/458 |

FOREIGN PATENT DOCUMENTS

| | | | |
|---|---|---|---|
| CN | 102668023 | A | 9/2012 |
| JP | 2002280531 | A | 9/2002 |
| JP | 2004311955 | A | 11/2004 |
| JP | 2009060142 | A | 3/2009 |
| JP | 2012178603 | A | 9/2012 |

* cited by examiner

SEMICONDUCTOR DEVICE AND METHOD FOR PRODUCING THE SAME

TECHNICAL FIELD

Embodiments described herein relate to semiconductor devices produced on substrates, in particular to methods for manufacturing such semiconductor devices on substrates comprising SiC.

BACKGROUND

Semiconductor devices employing SiC are usually expensive due to the high prices of the substrates, which are typically a main factor for the price of the manufactured product. This disadvantage is usually not compensable by other improvements like smaller losses of the product or the like.

There are some concepts pertaining to separating thin layers of SiC from a SiC wafer, to bond them onto carrier plates of carbon or metal, and to bring the resulting layer stack as a whole through the wafer production. Because the original SiC wafer would be reusable, in the case of SiC epitaxial layers even for an unlimited number of cycles, the amount of cost of the basic material could be significantly reduced in this case. However, the carrier stack would have to be able to withstand the high temperatures of the SiC device processing, and there would be no interaction allowed with process chemistry, handling and the like.

SUMMARY

In a first aspect, a method for producing a semiconductor device is provided. It includes: providing a semiconductor substrate; providing at least one semiconductor device on the substrate, having a back face opposite the semiconductor substrate and a front face towards the semiconductor substrate; providing a contact layer on the back face of the semiconductor device; bonding the contact layer to an auxiliary carrier; and separating the at least one semiconductor device from the substrate.

According to an embodiment, an intermediate product for the production of a semiconductor device is provided. It includes: a semiconductor substrate, a semiconductor device on the substrate, having a back face opposite the semiconductor substrate and a front face towards the semiconductor substrate, a contact layer on the back face of the semiconductor device, and an auxiliary carrier bonded to the contact layer.

Further aspects, advantages and features of the present invention are apparent from the dependent claims, the description and the accompanying drawings.

BRIEF DESCRIPTION OF THE DRAWINGS

A full and enabling disclosure including the best mode thereof, to one of ordinary skill in the art, is set forth more particularly in the remainder of the specification, including reference to the accompanying figures wherein.

The components in the figures are not necessarily to scale, instead emphasis being placed upon illustrating the principles of the invention. Moreover, in the figures, like reference numerals designate corresponding parts.

DETAILED DESCRIPTION

Reference will now be made in detail to the various embodiments, one or more examples of which are illustrated in each figure. Each example is provided by way of explanation and is not meant as a limitation. For example, features illustrated or described as part of one embodiment can be used on or in conjunction with other embodiments to yield yet further embodiments. It is intended that the present disclosure includes such modifications and variations.

In this regard, directional terminology, such as "top", "bottom", "front", "back", etc., is used with reference to the orientation of the Figure(s) being described. Because components of embodiments can be positioned in a number of different orientations, the directional terminology is used for purpose of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims. The embodiments can be combined unless noted otherwise. The drawings are not drawn to scale.

In the context of the present specification, the terms "in ohmic contact", "in electric contact", "in contact", "in ohmic connection", and "electrically connected" intend to describe that there is an ohmic electric connection or ohmic current path between two regions, portion or parts of a semiconductor device or between different terminals of one or more devices or between a terminal or a metallization and a portion or part of a semiconductor device.

The term "lateral" as used in this specification intends to describe an orientation parallel to a first main surface of a semiconductor substrate.

The term "vertical" as used in this specification intends to describe an orientation, which is arranged perpendicular to the first surface of the semiconductor substrate. The term "vertical power semiconductor device" shall signify a power semiconductor device in which the drift of charge carriers in the drift zone is vertical, i.e., perpendicular to the first surface of the semiconductor substrate.

In this specification, a second surface of a semiconductor substrate is considered to be formed by the lower or backside surface while the first surface is considered to be formed by the upper, front or main surface of the semiconductor substrate. The terms "above", "upper", "uppermost", "over", "on", and "below", "lower" "lowermost", and "under" as used in this specification therefore describe a relative spatial location of a structural feature to another structural feature with consideration of this orientation. The terms "directly above", "directly over", "directly on", "directly below", "directly under", "adjacent" and "connecting/connected", when used with respect to two layers, films, regions, sections, zones or other elements shall signify that these objects contact each other at least physically.

Embodiments of the present disclosure relate to vertical semiconductor devices, in particular SiC based devices, such as diodes, Schottky diodes, merged pin Schottky diodes, JFETs, MOSFETs, and the like, which are produced in reverse order on a semiconductor substrate comprising SiC. In the end phase of the production process, a backside contact is applied to a surface of the semiconductor device opposite the substrate. Subsequently, the backside contact is bonded to an auxiliary carrier, and the device is separated from the substrate. Thereby, it is made use of the property of SiC that typically, no considerable diffusion of dopants occurs.

For the separation, various methods are employed in embodiments. Examples are an ion implantation into the boundary region between the substrate and the semiconductor device followed by a heating step. This leads to an outgassing of the implanted ions and subsequently to a separation at the boundary region. Other separation methods include the application of laser light to the boundary region in order to cause a local overheating leading to a separation. Another variant includes the buildup of various layers of SiC with different modifications, such as a porous layer and a monocrystalline layer, which are later separated by a high pressure fluid jet, for example a water jet.

Figure 1:
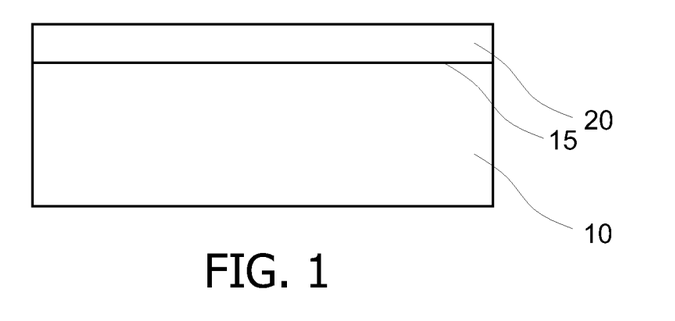
FIGS. 1 to 6 show the manufacturing process of a semiconductor device according to embodiments.

FIG. 1 illustrates first steps of a manufacturing process of an exemplary semiconductor device 75, namely a Schottky diode or merged pin Schottky diode according to embodiments. Merged pin Schottky diodes or pin diodes may in embodiments comprise $pn^-n$ and $pp^-n$ structures. A SiC substrate 10 is provided, onto which a first semiconductor layer 20 comprising SiC, henceforth called first layer 20, is epitaxially deposited. The border region between the SiC substrate 10 and the semiconductor layer 20 will later form a front face 15 of the semiconductor device 75 manufactured in the process.

Figure 2:
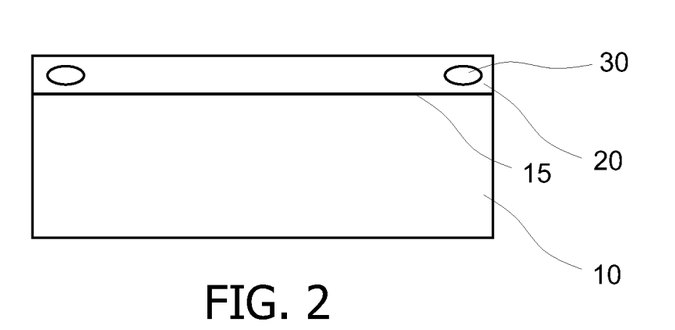

FIG. 2 illustrates that p-doped regions 30 for the lateral termination system of the diode or for a fortification of the anode, as for a merged pin Schottky diode, are implanted into first layer 20. Optionally, the p-doped regions 30 are subsequently annealed to reduce defects.

Figure 3:
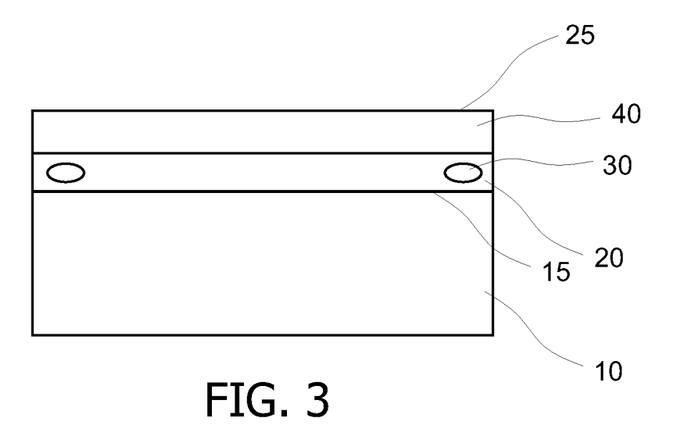

FIG. 3 illustrates the subsequent epitaxial deposition of a second semiconductor layer 40 comprising SiC, henceforth called second layer 40, having a doping for the drift zone of the semiconductor device. Optionally, the doping rate increases with the duration of the deposition to achieve a field stop. The surface of the second layer 40 directed away from the substrate 10 forms a back face 25 of the Schottky diode 75.

Figure 4:
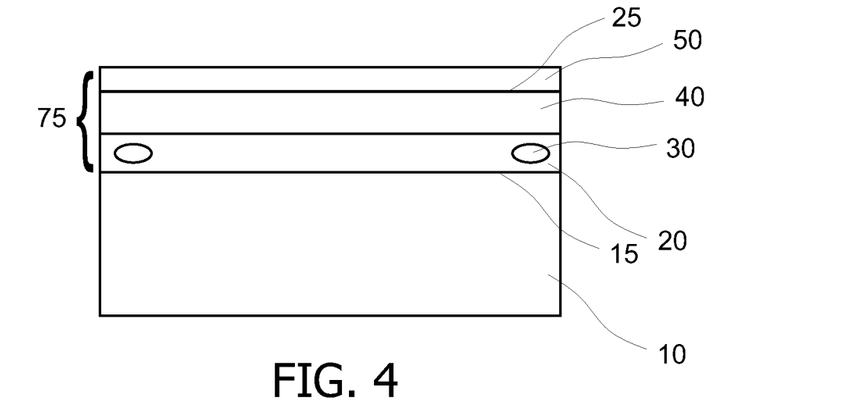

In FIG. 4, a cathode contact region is implanted into the second layer 40. The contact region is subsequently annealed, and a metal contact layer 50 is applied to the second layer 40.

Figure 5:
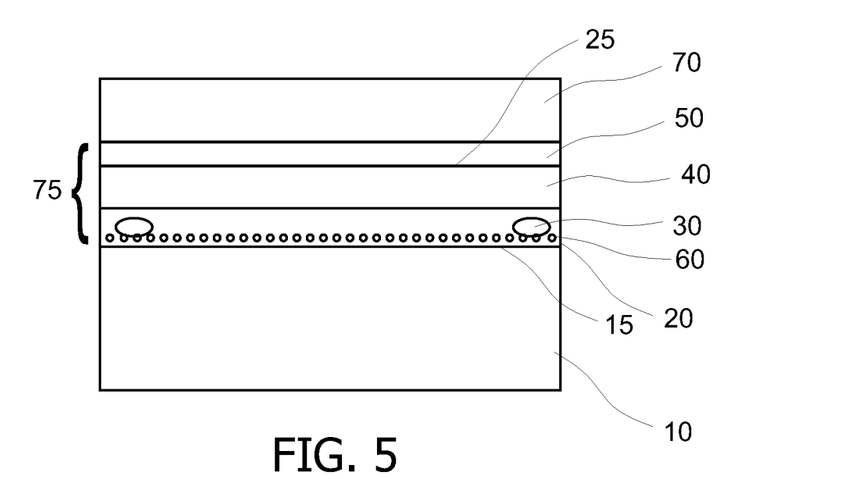

FIG. 5 illustrates schematically how ions 60 are implanted into the boundary region between the semiconductor substrate 10 and the first layer 20 with a relatively high ion dose per unit area of the targeted material. Preferably, these ions are protons with an energy from 300 keV to 1.5 MeV, more preferably between 500 keV and 1.2 MeV, which are typically applied from the side of the contact layer 50. In embodiments, the ions may alternatively comprise alpha particles. In this case, the energy of the implantation may be increased compared to protons. Generally, the implantation energy has to be selected in order to achieve a projected range of the implanted ions to reach at least the depth of the p-doped regions 30. After the ion implantation, an auxiliary carrier 70 is applied to the metal contact layer 50. The auxiliary carrier may comprise silicon, metal, carbon, ceramics, and glass, or other suitable materials.

Figure 6:
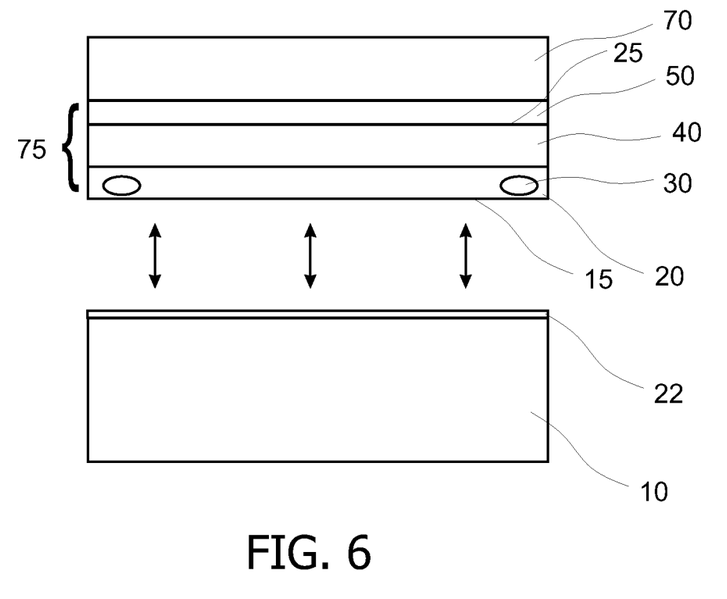

FIG. 6 shows the subsequent separation of the previously produced semiconductor device 75, which in this embodiment is the Schottky diode, from the SiC substrate 10 by heating. If the applied ion dose is sufficiently chosen, the heating leads to a build-up of hydrogen from the implanted ions 60, which leads to microbubbles locally destroying the bond between the semiconductor substrate 10 and the semiconductor element 75 produced thereon. In FIG. 6, it is shown that the separation between the substrate 10 and the semiconductor device 75 may occur not at the exact boundary region between first layer 20 and substrate 10, but that a thin residual layer 22 of layer 20 may persist on the substrate 10. In practical use, the exact location of the separation may be influenced by the deposition of the ions 60 into the boundary region. Residual layer 22 is not shown in other Figures for illustrational purposes, though in embodiments it may be present depending on the chosen detailed properties of the separation process.

Figure 7:
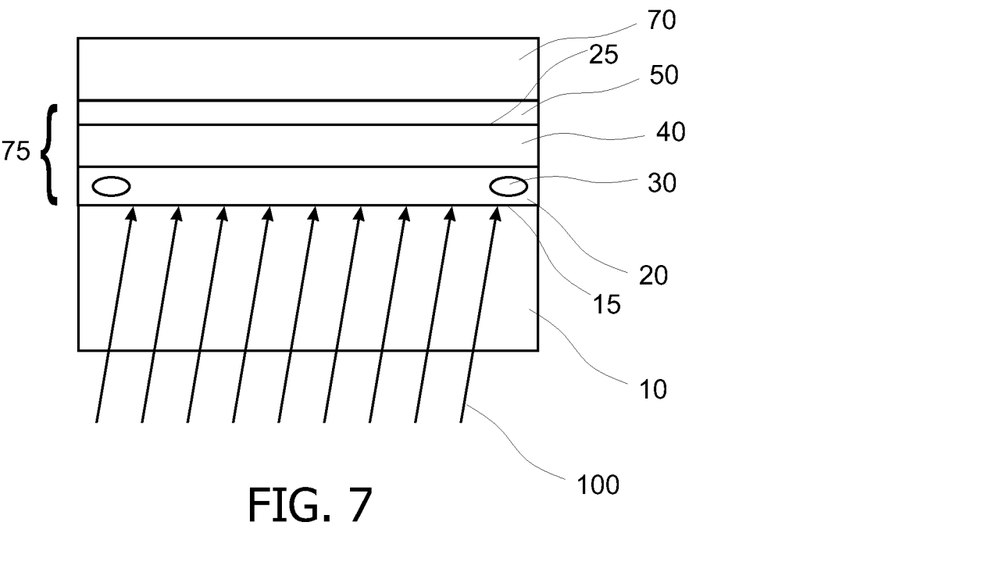
FIGS. 7 and 8 show a separation of an intermediate product according to embodiments.
Figure 8:
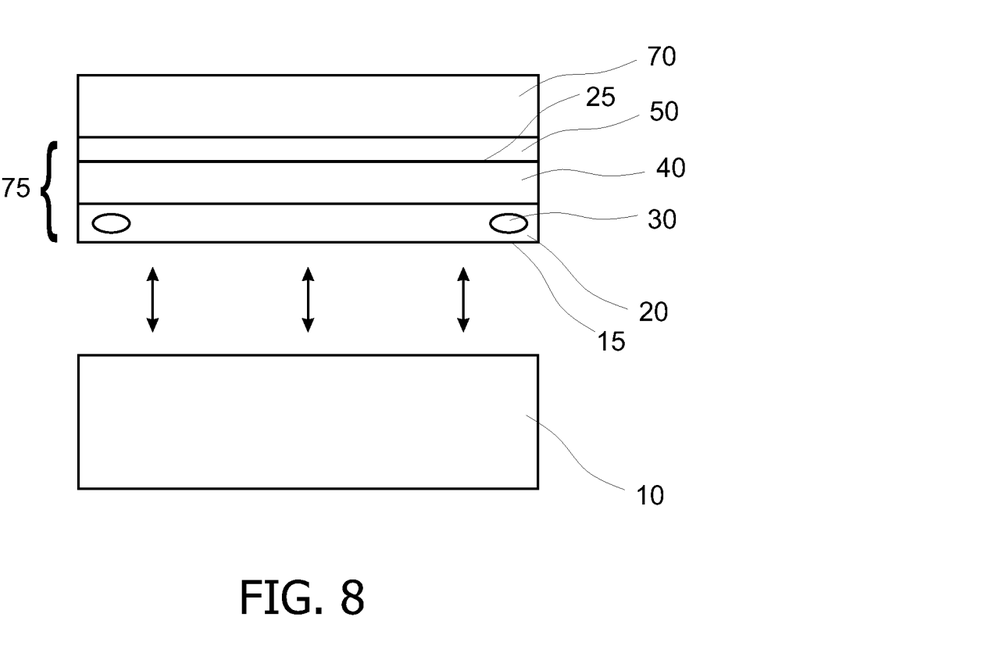
Figure 9:
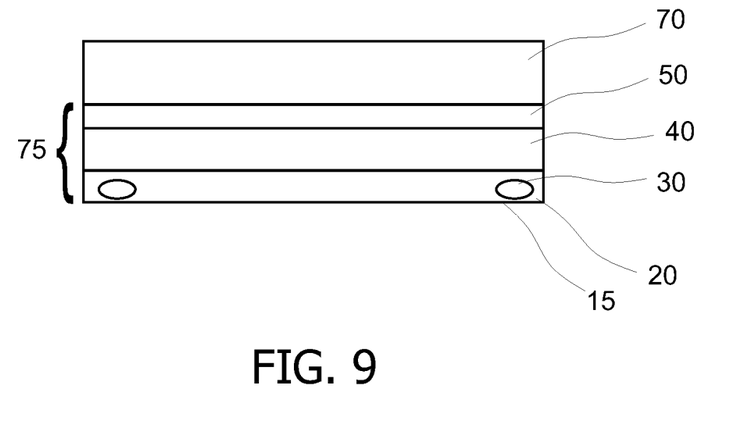
FIGS. 9 and 10 show further manufacturing steps according to embodiments.

In embodiments schematically illustrated in FIG. 7, the separation may also be executed without the previously described ion implantation, but by applying highly focussed laser light 100 onto the boundary region between semiconductor substrate 10 and the semiconductor device 75, here the Schottky diode. The light leads to a localized overheating of the material in the boundary region between the semiconductor substrate 10, typically comprising SiC, and the semiconductor device 75 produced as described hereinbefore. In FIG. 8, the resulting separation of the semiconductor substrate 10 is depicted, leading to the separated semiconductor device 75 together with the auxiliary carrier 70 shown in FIG. 9.

Figure 10:
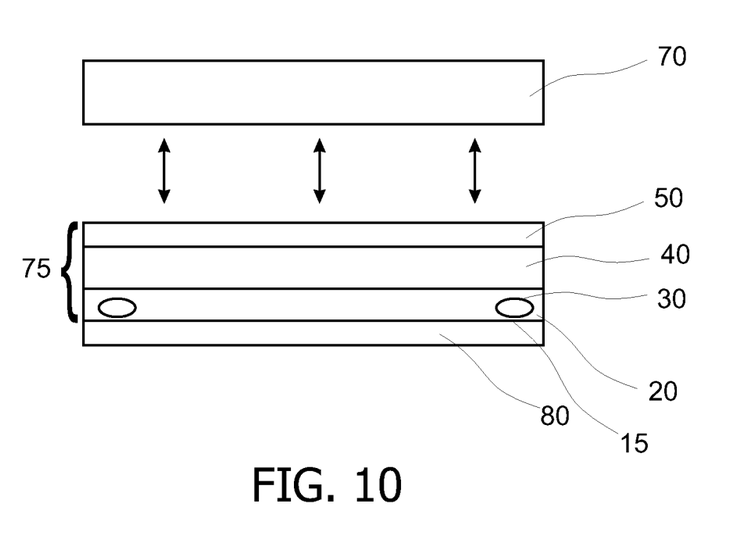

In FIG. 10, the optional subsequent separation of the auxiliary carrier layer 70 is shown.

Figure 11:
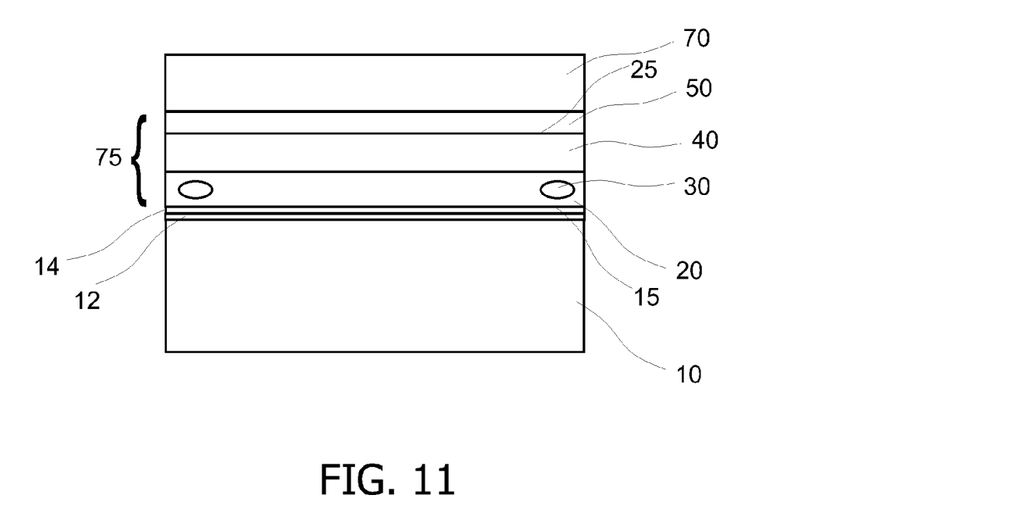
FIG. 11 shows an intermediate product according to embodiments.
Figure 12:
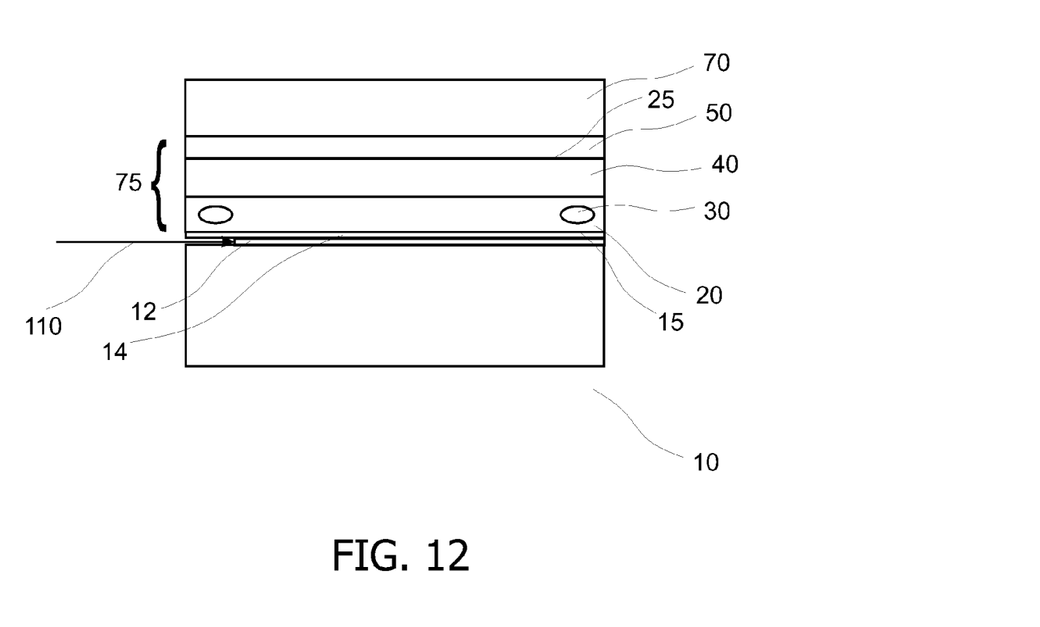
FIG. 12 shows a separation of an intermediate product according to embodiments.

In embodiments illustrated in FIG. 11, the separation process may also be carried out by building a porous SiC layer 12 on the SiC semiconductor substrate 10, which is subsequently covered with a monocrystalline SiC layer 14, on which the semiconductor device 75 is produced. Instead of the ion 60 or laser induced separation as described before, the porous SiC layer 12 may be destroyed by a high pressure water jet 110 such as schematically shown in FIG. 12, leading to the desired separation. The front face 15 of the semiconductor device, which is laid open by the separation process, is then typically subject to further processing, which includes at least one of forming a metallization and a passivation. Prior to the metallization, the exposed front face 15 of the semiconductor device may be treated. The treatment may comprise mechanical treatments such as polishing, and/or chemical treatment such as etching, and/or a combination of mechanical and chemical treatment such as chemical mechanical polishing (CMP). The semiconductor device may optionally be separated from the auxiliary carrier 70 as was shown with respect to FIG. 10.

The separated SiC semiconductor substrate 10 may subsequently be reused for a further process cycle producing a further semiconductor device. In embodiments, the surface of the substrate may be surface treated prior to the reuse, wherein the treatment may comprise mechanical treatments such as polishing, and/or chemical treatment such as etching, and/or a combination of mechanical and chemical treatment such as chemical mechanical polishing (CMP), and/or an epitaxial deposition step.

The semiconductor device 75, typically comprising at least one layer comprising SiC, which is produced on the semiconductor substrate 10, typically comprising SiC, may in embodiments be one of a diode, a Schottky diode as described before, a JFET, and a MOSFET. In some embodiments, the semiconductor device does not comprise a gate oxide.

In embodiments, the semiconductor substrate 10 may have a thickness from 0.2 mm to 1.0 mm, more preferably from 0.4 mm to 0.8 mm.

In the process of manufacturing the semiconductor device 75, the system of the semiconductor substrate 10 together with the semiconductor device formed thereon is regarded as an intermediate product in the manufacturing process. The semiconductor device 75 has a back face 25 opposite the semiconductor substrate 10 and a front face 15 towards the semiconductor substrate 10, a contact layer 50 on the back face 25 of the semiconductor device 75, and typically an auxiliary carrier 70 bonded to the contact layer 50.

Figure 13:
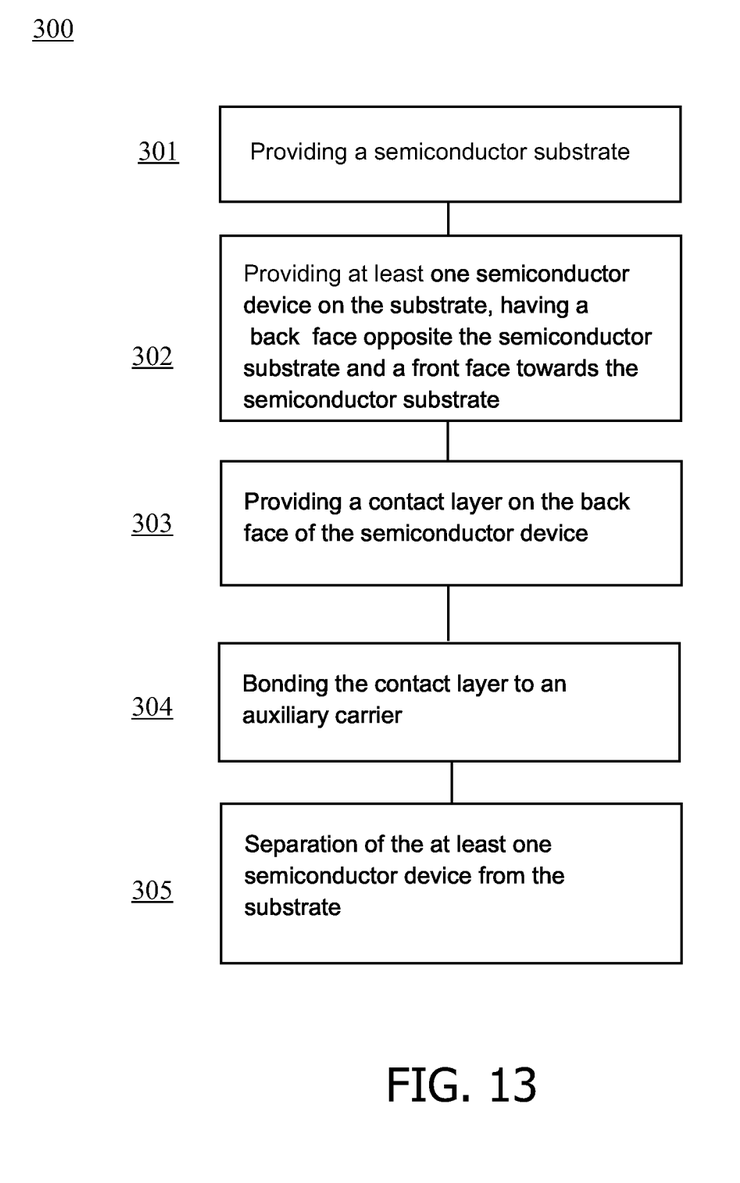
FIG. 13 schematically shows a method according to embodiments.

FIG. 13 shows a method 300 for producing a semiconductor device 75 according to embodiments. It includes providing a semiconductor substrate in a block 301, providing at least one semiconductor device on the substrate, having a back face opposite the semiconductor substrate and a front face towards the semiconductor substrate in a block 302, providing a contact layer on the back face of the semiconductor device in a block 303, bonding the contact layer to an auxiliary carrier in a block 304, and separating the at least one semiconductor device from the substrate in a block 305.

Exemplary embodiments of systems and methods for producing a semiconductor device are described above in detail. The systems and methods are not limited to the specific embodiments described herein, but rather, components of the systems and/or steps of the methods may be utilized independently and separately from other components and/or steps described herein. For example, other types of semiconductor devices may be produced by the described methods, and are not limited to practice with only the semiconductor devices as described herein. Rather, the exemplary embodiment can be implemented and utilized in connection with many other semiconductor devices.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. While various specific embodiments have been disclosed in the foregoing, those skilled in the art will recognize that the spirit and scope of the claims allows for equally effective modifications. Especially, mutually non-exclusive features of the embodiments described above may be combined with each other. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A method for producing a semiconductor device, comprising:
   providing a semiconductor substrate;
   providing at least one semiconductor device directly on the substrate, having a back face opposite the semiconductor substrate and a front face directly adjoining the semiconductor substrate, wherein the semiconductor device is at least one of: a diode; a JFET; and a MOSFET,
   providing a contact layer on the back face of the semiconductor device;
   bonding the contact layer to an auxiliary carrier;
   separating the at least one semiconductor device from the substrate; and
   separating the semiconductor device from the auxiliary carrier,
   wherein the at least one semiconductor device is provided directly on the substrate such that an interface between the semiconductor substrate and the front face of the semiconductor device comprises a junction between two regions which include the same semiconductor material.

2. The method of claim 1, wherein the semiconductor substrate comprises SiC.

3. The method of claim 1, wherein the semiconductor device comprises at least one layer comprising SiC.

4. The method of claim 1, wherein the front face of the semiconductor device is further processed after separation from the semiconductor substrate, wherein the further processing comprises at least one of: forming a metallization; and a passivation.

5. The method of claim 1, wherein the semiconductor substrate is reused, after separation from the semiconductor device, to produce a further semiconductor device.

6. The method of claim 5, wherein the semiconductor substrate is surface-treated prior to the reuse.

7. The method of claim 1, wherein the at least one semiconductor device does not comprise a gate oxide.

8. The method of claim 1, wherein the auxiliary carrier comprises at least one of the elements selected from the group consisting of: silicon; metal; carbon; ceramics; and glass.

9. The method of claim 1, wherein separating the at least one semiconductor device from the semiconductor substrate comprises splitting the semiconductor device from the substrate.

10. The method of claim 1, wherein there is a boundary region between the at least one semiconductor device and the semiconductor substrate, and wherein the separation is carried out by implanting ions into the boundary region and by subsequently heating the boundary region in order to produce gas microbubbles causing the separation.

11. The method of claim 10, wherein the ions comprise protons.

12. The method of claim 10, wherein the ions comprise protons, and wherein the implantation energy of the protons is adapted such that the protons are deposited in the boundary region between the at least one semiconductor device and the semiconductor substrate.

13. The method of claim 10, wherein the ions comprise protons with an energy from 300 keV to 1.5 MeV.

14. The method of claim 1, wherein separating the at least one semiconductor device from the semiconductor substrate comprises applying laser light through the substrate to the boundary region between the at least one semiconductor device and the semiconductor substrate, in order to achieve a local overheating causing the separation.

15. The method of claim 1, wherein the semiconductor substrate has a thickness from 0.2 to 1.0 mm.

16. The method of claim 1, wherein providing at least one semiconductor device comprises:
- depositing a first epitaxial layer on the semiconductor substrate;
- implanting a dopant into the epitaxial layer; and
- depositing a second epitaxial layer on the first epitaxial layer.

17. The method of claim 1, wherein providing at least one semiconductor device comprises growing a first layer directly on the semiconductor substrate.

18. The method of claim 17, wherein providing at least one semiconductor device comprises epitaxially growing a first epitaxial layer directly on the semiconductor substrate, wherein a boundary between the first epitaxial layer and the semiconductor substrate forms the front face of the at least one semiconductor device.

19. The method of claim 1, wherein the substrate comprises an SiC layer, wherein providing the at least one semiconductor device directly on the substrate comprises directly interfacing the SiC layer with the semiconductor device, and wherein separating the at least one semiconductor device from the substrate comprises locally destroying a bond between the SiC layer and the semiconductor device.

20. The method of claim 1, wherein the semiconductor device includes a single semiconductor material extending from the back face to the front face.

21. The method of claim 20, wherein the single semiconductor material is SiC-based.

22. The method of claim 1, wherein the semiconductor material at the junction between two regions is SiC-based.

23. The method of claim 1, wherein the front face directly adjoining the semiconductor substrate forms a functional layer of the semiconductor device after the separation of the at least one semiconductor device from the substrate.

* * * * *